United States Patent
Barczyk et al.

(10) Patent No.: US 9,417,273 B2
(45) Date of Patent: Aug. 16, 2016

(54) ASYNCHRONOUS AC MEASUREMENT SYSTEM

(71) Applicant: Guideline Instruments Limited, Smiths Falls (CA)

(72) Inventors: Tomasz Barczyk, Ottawa (CA); Petar Miljanic, Belgrade (RS); Iain Page, Ottawa (CA)

(73) Assignee: Guildline Instruments Limited (CA)

( * ) Notice: Subject to any disclaimer, the term of this patent is extended or adjusted under 35 U.S.C. 154(b) by 606 days.

(21) Appl. No.: 13/866,433

(22) Filed: Apr. 19, 2013

(65) Prior Publication Data

US 2013/0282315 A1    Oct. 24, 2013

Related U.S. Application Data

(60) Provisional application No. 61/636,955, filed on Apr. 23, 2012.

(51) Int. Cl.
*H02H 3/40* (2006.01)
*G01R 21/06* (2006.01)
*G01R 19/25* (2006.01)

(52) U.S. Cl.
CPC .......... *G01R 21/06* (2013.01); *G01R 19/2513* (2013.01)

(58) Field of Classification Search
CPC ...................................................... G01R 21/06
USPC .......................................... 361/79, 80; 702/61
See application file for complete search history.

(56) References Cited

U.S. PATENT DOCUMENTS 5,453,903 A * 9/1995 Chow ................... H02H 3/40
                                                                361/79

* cited by examiner

*Primary Examiner* — Lam Nguyen
(74) *Attorney, Agent, or Firm* — Akerman LLP

(57) ABSTRACT

Accurate measurements of electrical power at various points of a power grid is becoming more important and, at the same time, is getting more difficult as the old power distribution model of a few, large power generating stations and a multitude of relatively linear loads is replaced by a newer model containing a multitude of smaller, and to some degree unpredictable power sources, as well as a multitude of not always linear and often smart (essentially also unpredictable) loads. Embodiments of the invention provide for high accuracy voltage, current and power measurements of quasi-stationary and stationary waveforms in single and multiple phase power systems. Precision AC voltage, current, phase, power and energy measurements in power networks may be measured with current ranges from 1 mA to 20 kA and voltage ranges from 1V to 1000 kV and in a frequency range from a few hertz to one hundred kilohertz.

18 Claims, 11 Drawing Sheets

ASYNCHRONOUS AC MEASUREMENT SYSTEM

CROSS-REFERENCE TO RELATED APPLICATIONS

This patent application claims the benefit of U.S. Provisional Patent Application 61/636,955 filed Apr. 23, 2012 entitled "Asynchronous AC Measurement System".

FIELD OF THE INVENTION

This invention relates generally to precision AC measurements, which include precision AC current, voltage, phase, impedance, frequency, power and energy measurements, in the current range from 1 mA or less to 20 kA or greater and voltage range of 1V or less to 1000 kV or greater and in a frequency range from a few hertz to one hundred kilohertz. In particular it relates, but is not limited to AC measurements as applicable in power transmission and distribution networks.

BACKGROUND OF THE INVENTION

The accurate AC measurement of electrical power at various points of a power grid is becoming more and more important and, at the same time, is getting more and more difficult. The old power distribution model of a few, large power generating stations and a multitude of relatively linear loads is being replaced by a newer model containing a multitude of smaller, and to some degree unpredictable power sources, as well as a multitude of not always linear and often smart (essentially also unpredictable) loads. This change deteriorates power quality and makes AC measurements, grid management and troubleshooting more difficult. Also, the increasing cost of electrical power makes precise calculations of delivered energy and monitoring of power quality important.

There are three main categories of AC power measurement systems: The highest level of accuracy, used typically by the Standard and Calibration Laboratories, developed to reference measurement to the National Standards. These are typically unique installations, not covered by specific regulatory requirements. The next category is high precision AC power measurement systems. In the important case of AC power measurement instruments, usually referred to as Power Analyzers, these would be units meeting the requirements of standards, such as for example International Standard IEC 61000-4-30 "Electromagnetic Compatibility: Part 4-30 Testing and Measurement Techniques—Power Quality Measurement Methods" which relates to Class A measurement methods. These are used where precise measurements are necessary, for example for contractual applications and disputes, verifying compliance with standards, etc. Two different Class A instruments, when measuring the same quantities, should produce matching results within the specified uncertainty for that parameter. The third main category of the AC power measurement system is general use instruments. Generally it is recommended that this group reflect measurement methods and intervals of Class A instruments, with lower precision and processing requirements. It is then classified as Class S. Other instruments including legacy installations, whose operation doesn't reflect methods of Class A, but still meet key accuracy requirements, are summarily called Class B. Irrespective of the class of the AC power measurements they require determination of the voltage, current and timing of the single or multiple phases of the power system in order to perform the measurements.

The whole measurement chain of electrical quantity for power analysis consists of measurement transducer, measurement unit and evaluation unit (as is defined in the ICE 61000-4-30 standard). The measurement transducer converts the input quantity to a level and a kind suitable for the measurement unit and typically has some other functionality, for example signal isolation or overload protection. For example, the measurement transducer may reduce a power line voltage of hundreds of kilovolts to tens of volts. The measurement unit then converts the input quantity, typically to a digital form, suitable for evaluation. Then the evaluation unit, which is typically some form of a computing device, receives and combines data streams from different input channels including for example the output of the measurement unit and a reference unit, and does the required calculations to produce results. Test results can be: recorded, aggregated, automatically evaluated in the real time, displayed on the instrument screen, used to generate alarms, placed in system logs, and send out for external evaluation and storage, etc.

AC power measurement requires information on the voltage, current and the relative position between the two. For multi-phase power systems additional information on the relationship between the multiple phases is also required. Some systems also capture information on the current and voltage of the return line. As a rule, the input quantities are accessible only via measurement transducers. Typically the precision of the transducer and the measurement unit determine the overall precision of the system.

A precise voltage transducer typically has the form of a resistor divider, often with reactive frequency compensation. In some applications a voltage transformer, or an inductive divider (autotransformer), may also be used. Other forms of transducer may rely on a capacitor divider, or electrostatic effects.

In contrast, a precise current transducer has typically the form of a multiple stage transformer, or a shunt resistor. Other kinds of transducer may use, for example, a single core current transformer, a Rogowski coil, a Hall Effect sensor, or a fiber optic sensor. Current clamps, a popular physical form of current sensors, usually employ a single stage current transformer, a Hall effect transducer, or a Rogowski coil.

High precision AC measurements require precise analog to digital conversion and precise timing information. To increase precision and measurement repeatability, the typical implementation in the prior art requires that the sampling frequency is synchronized to the fundamental frequency of the incoming signal and the number of samples per period is constant. Synchronization to the fundamental frequency allows for accurate, repeatable measurements of magnitude, frequency and phase of the tested signal. This method requires that the signal under test is stationary. Testing non-stationary waveforms, e.g. slowly varying, noisy, or jittery for example, typically results in increase of measurement uncertainty.

Data incoming from the input channels is typically passed through an extensive range of signal processing blocks. Basic parameters of the input signals being calculated by these and limits on the uncertainty of the determined results depend primarily on the precision of the measurement transducers, measurement units (A/D conversion generally dominating), the timing reference, and analysis algorithms employed.

Power and power quality measurements are important part of the AC measurements. Power quality is characterized by one or more parameters, some of the wide range of parameters being defined for example in the IEC 61000 "Testing and Measurement Techniques—Power Quality Measurement Methods", IEEE 1159 "IEEE Recommended Practice for Monitoring Electric Power Quality", and EN50160 "Voltage Characteristics in Public Distribution Systems" specifications and standards. Computer based evaluation units, supplemented with a Coordinated Universal Time (UTC) block can provide tools to analyze power according to any of these standards.

Accordingly it would be beneficial to provide power utilities, independent electricity producers, electrical engineers and technicians, and others requiring accurate measurements of power systems with a field deployable power system measurement devices providing Class A type performance but in rugged devices of reduced cost and complexity. It would be further beneficial if the same principles allowed such devices according to some embodiments of the device to achieve performance approaching that of reference measurements operating in laboratory conditions.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to provide precision AC measurements, which include precision AC current, voltage, phase, impedance, frequency, power and energy measurements, in the current range from 1 mA or less to 20 kA or greater and voltage range of 1V or less to 1000 kV or greater and in a frequency range from a few hertz to one hundred kilohertz. In particular it relates, but is not limited to AC measurements as applicable in power transmission and distribution networks.

In accordance with an embodiment of the invention there is provided an asynchronous AC measurement system comprising:
  an isolated current channel converter that transforms a current applied to the input by a power signal to a current within a predetermined range and digitizes said current;
  an isolated voltage channel converter that transforms a voltage applied to the input by the power signal to a voltage within a predetermined range and digitizes said voltage; and
  a digital analyzer comprising at least a microprocessor that processes said digital representations of the voltage and current of the input signal to determine at least one of a parameter of the input signal and a power quality parameter of the input signal.

In accordance with an embodiment of the invention there is provided a method comprising:
  providing an isolated current channel converter for transforming a current applied to a load by a power signal to a current within a predetermined range and digitizing said current;
  providing an isolated voltage channel converter for transforming a voltage applied to the load by the power signal to a voltage within a predetermined range and digitizing said voltage; and
  providing a digital analyzer comprising at least a microprocessor for processing said digital representations of the voltage and current of the power signal to determine at least one of the power of the power signal and a power quality parameter of the power signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION OF THE PREFERRED EMBODIMENT

Figure 1:
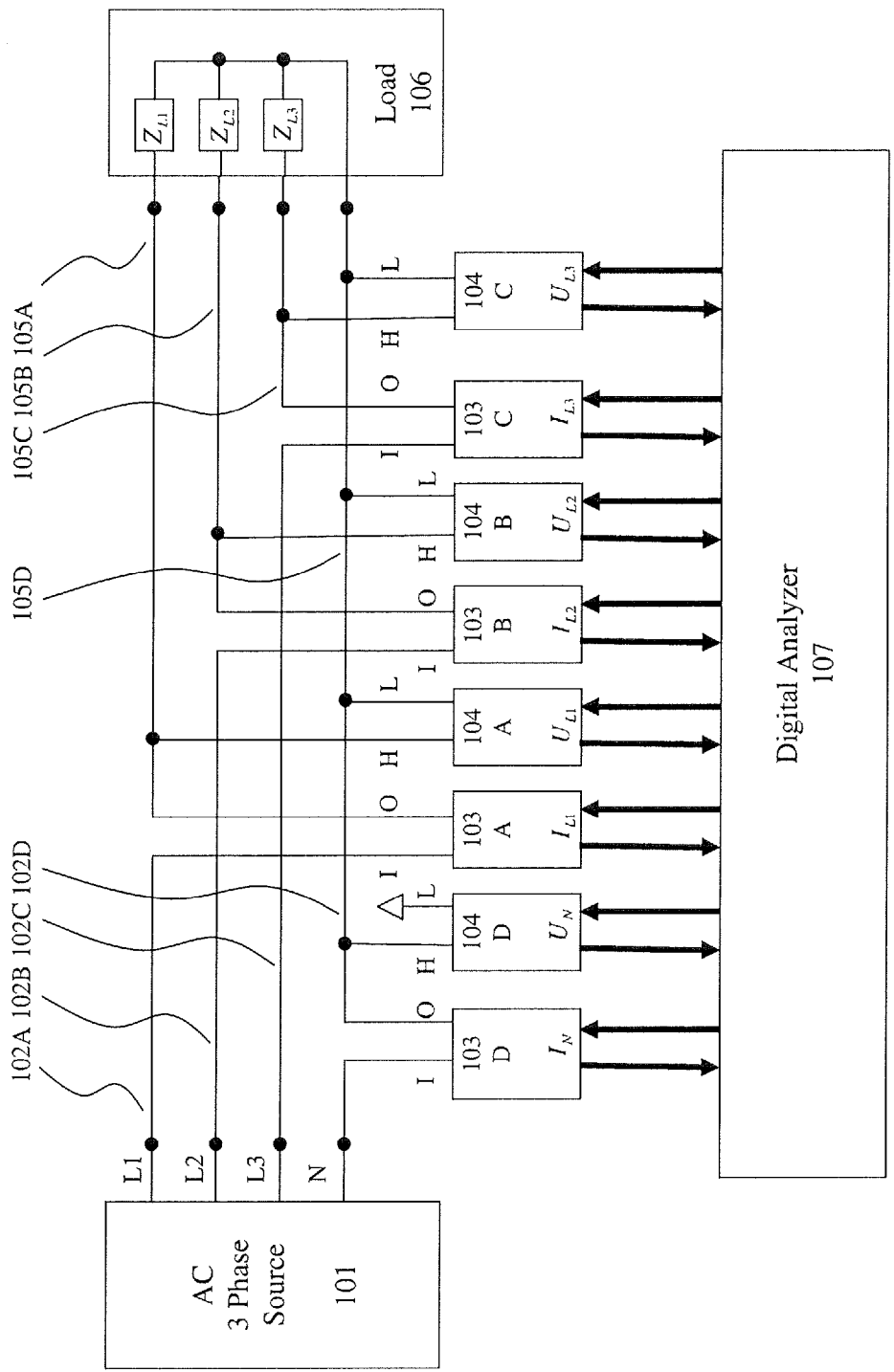
FIG. 1 depicts a block diagram according to an embodiment of invention for an Asynchronous AC Meter or Power Analyzer illustrating exemplary connections to the power transmission line and subsystems.

This invention relates generally to precision AC measurements, which include precision AC current, voltage, phase, impedance, frequency, power and energy measurements, in the current range from 1 mA or less to 20 kA or greater and voltage range of 1V or less to 1000 kV or greater and in a frequency range from a few hertz to one hundred kilohertz. In particular it relates, but is not limited to AC measurements as applicable in power transmission and distribution networks.

The ensuing description provides exemplary embodiment (s) only, and is not intended to limit the scope, applicability or configuration of the disclosure. Rather, the ensuing description of the exemplary embodiment(s) will provide those skilled in the art with an enabling description for implementing a exemplary embodiment. It being understood that various changes may be made in the function and arrangement of elements without departing from the spirit and scope as set forth in the appended claims.

Precise AC power measurements require precise determination of the voltage, current and timing of the single or multiple phases. Data acquisition within an Asynchronous AC Measurement System according to embodiments of the invention described below in respect of FIGS. 1 to 6 consists of eight free running, 24-bit channels. Four of these channels monitor voltage through voltage converters whilst four monitor current through current converters. All converters use the same high stability internal reference clock for conversion and, at the beginning of each data acquisition session, the conversion cycle of all of the A/D converters is synchronized. A dedicated functional block signals when the synchronicity of any of the channels is lost during operation. The internal reference clock is not synchronized with the input signal within the embodiment presented.

Each of the input channels is fully isolated and inputs may be biased up to a predetermined specified dielectric strength voltage. Signal processing in the measurement unit is reduced and consists only of anti-aliasing filtering and range switching. Special care within the design is taken to minimize common mode sensitivity, to equalize delays and to minimize crosstalk between channels. This allows for sustained accuracy and maximum instrument flexibility when operating in various configurations, such as for example Y, or Δ configurations, with, or without availability of the ground, or return to be used as a reference.

Input of each voltage channel (the measurement transducer) consists of a high stability resistive voltage divider, followed by a simple, single stage sensitivity switch. The input signal drives a fully differential amplifier block, with differential inputs and differential outputs. The outputs of this amplifier then drives a differential input of the analog to digital converter (A/D converter). The amplifier and A/D converter are referenced to the input terminals only. Output data is provided via a digital isolator. Common mode rejection of each channel is improved in three stages: First, the fully differential amplifier following the input divider reduces it. It is further reduced by the common mode rejection coefficient of the A/D converter. Finally, the digital isolator minimizes effects of common mode input swing on the amplifier and converter. Aliasing is reduced by a two-stage analog low pass (LP) filter which may be discrete or provided as part of the amplifier block and by digital filtering internal to the A/D converter.

Input of each current channel (the measurement transducer) consists of a high accuracy dual stage current transformer, followed by a single stage sensitivity switch and a fully differential amplifier. The differential amplifier then drives a differential A/D converter. Common mode rejection of the channel is improved in three stages: First, the shield between the primary and secondary windings of the dual stage current transformer provides common mode isolation. Next, the fully differential amplifier reduces it further. Finally, it is also reduced by the common mode rejection factor of the A/D converter. Aliasing is reduced by a two-stage analog LP filter (which may be part of the amplifier block or discrete) in a similar manner to that employed for the voltage channels.

A microprocessor executing one or more software applications processes the received digital data from all the channels. First, the data is monitored by a set of level and overload monitors and a series of high-pass and low-pass filters. Subsequently one or more software tools selected by a user from a suite of digital signal processing (DSP) software tools is used to continuously process and analyze the data and calculate the resulting requested parameters, flags and alarms. The results can be monitored in the real time on a screen of Asynchronous Power Measurement System, commonly referred to as the Analyzer, in digital or analog form, as well as be aggregated, synchronized to the UTC, then stored, logged, or transmitted for remote use.

With reference to FIG. 1 a block diagram according to an embodiment of invention for an Asynchronous AC Meter is presented comprising an external Power Source (101) which is connected to first to fourth Cables 102A through 102D respectively, which in turn are connected to inputs I of first to fourth Current Channels 103A through 103D respectively. The outputs O of the first to fourth Current Channels 103A through 103D respectively are connected to first to eighth Cables 105A through 105D respectively. First to third Cables 105A through 105C respectively are in turn connected to the inputs of Load 106 whilst fourth Cable 105D is connected to the common return point of Load 106.

Inputs to the Load 106 are also connected to input H of first to third Voltage Channels 104A through 104C respectively, whilst input L of these first to third Voltage Channels 104A through 104C respectively are connected to the common return point of the Load 106. This common return point is connected to input H of the fourth Voltage Channel 104D, while input L of this channel is connected to ground (earth).

Each of the eight input channels on first to fourth Current Channels 103A through 103D respectively and first to fourth Voltage Channels 104A through 104D respectively are connected to the Multichannel Digital Analyzer 107 through bidirectional digital interfaces.

Figure 2:
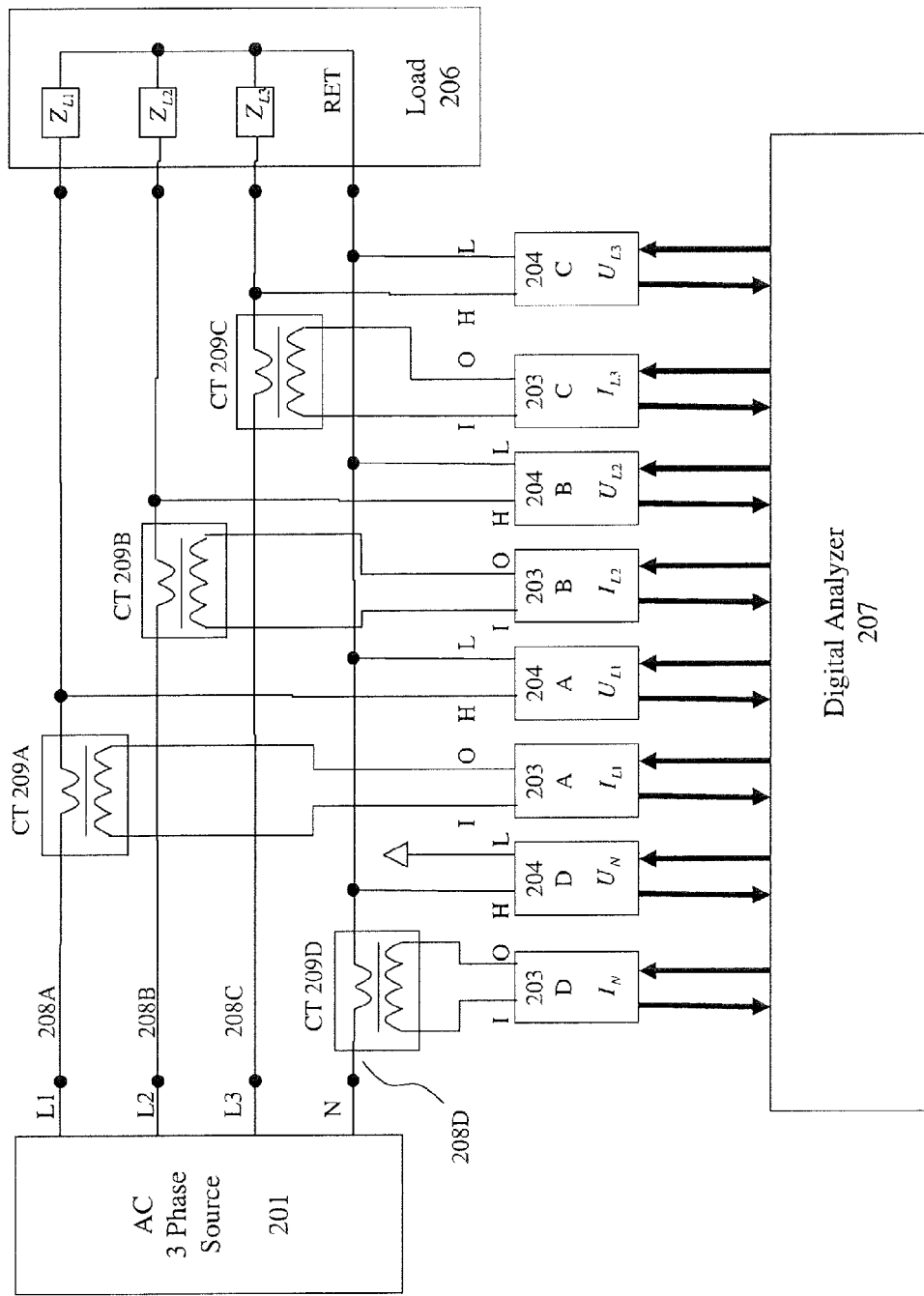
FIG. 2 depicts a block diagram according to an embodiment of invention for an Asynchronous AC Meter or Power Analyzer illustrating exemplary connections to the power transmission line and subsystems wherein current clamps are employed on the monitored lines.

Now referring to FIG. 2 there is depicted a block diagram according to an embodiment of invention for an Asynchronous AC Meter illustrating exemplary connections to the power transmission line and subsystems wherein current clamps are employed on the monitored lines. As shown an external Power Source 201 is connected to first to fourth Cables 208A through 208D respective. First to third Cables 208A through 208C are in turn connected to a Load 206 and the fourth Cable 208D is connected to the common return point of Load 206. Each of the first to fourth Cables 208A through 208D respectively passes through one of first to fourth Current Transformers 209A through 209D respectively, which for example be split core current transformer (Current Clamp). Leads of each of the first to fourth Current Transformers 209A through 209D respectively are connected to the inputs I and O of the corresponding first to fourth Current Channels 203A through 203D respectively. Optionally, each of the As an alternate implementation, each of the first to fourth Current Transformers 209A through 209D respectively is connected to one corresponding first to fourth Current Channels 203A through 203D respectively through a dedicated connector.

The inputs to the Load 206 are connected to the respective input H of the associated first to third Voltage Channels 204A through 204C respectively, while input L of these channels are connected to the common return point of the Load 206. The common return point is connected to input H of the fourth Voltage Channel 204D, while input L of this channel is connected to ground (earth.).

As with FIG. 1 each of the eight input channels on first to fourth Current Channels 203A through 203D respectively and first to fourth Voltage Channels 204A through 204D respectively are connected to the Multichannel Digital Analyzer 207 through bidirectional digital interfaces.

Figure 3:
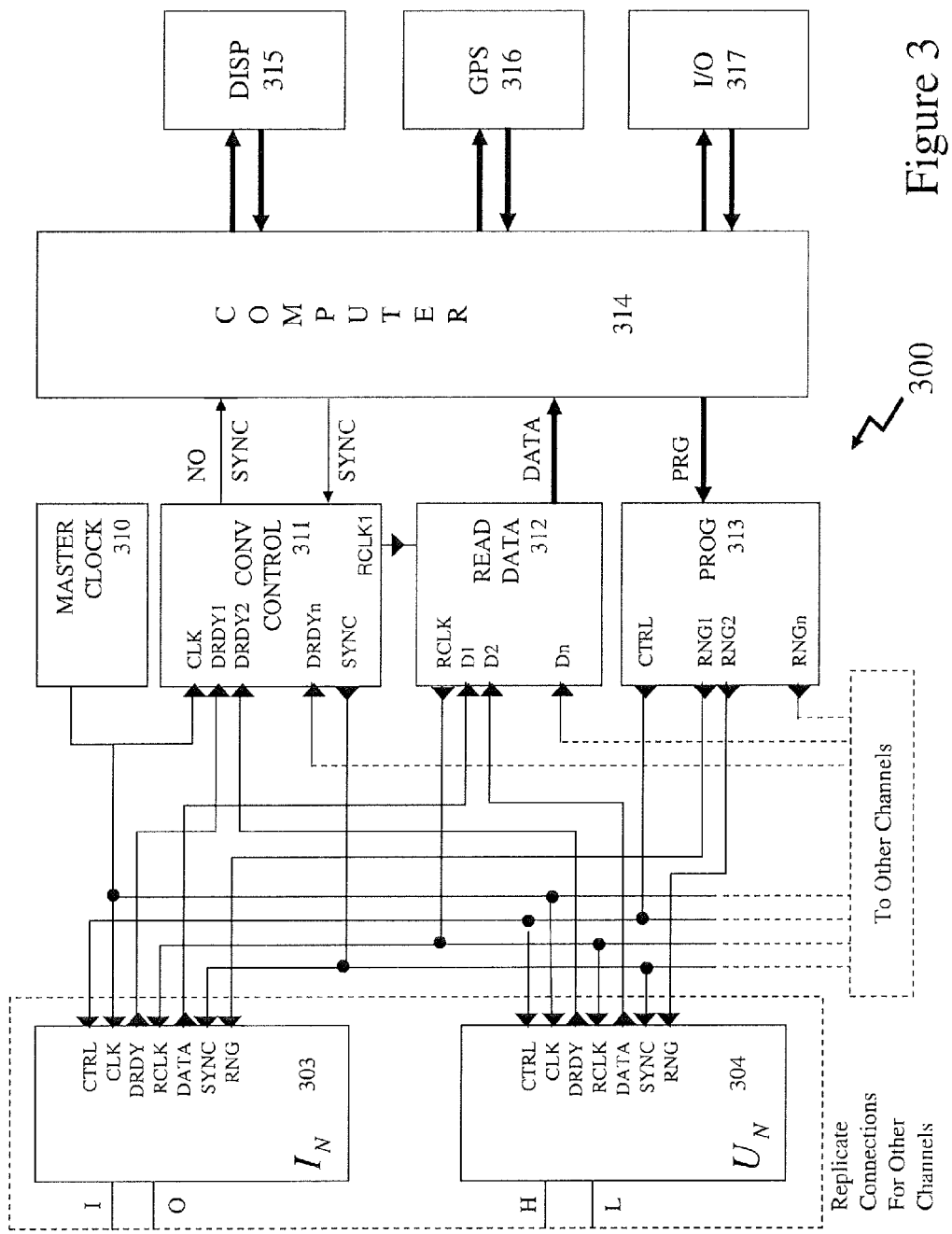
FIG. 3 depicts a block diagram according to an embodiment of invention of the Digital Analyzer of the system depicted in FIG. 1.

Now referring to FIG. 3 there is depicted a block diagram of a Multichannel Digital Analyzer 300 such as described above in respect of Multichannel Digital Analyzers 107 and 207 in FIGS. 1 and 2 respectively. As depicted the Multichannel Digital Analyzer 307 consists of a Master Clock 310, a Converter Control 311, a Data Read block 212, a Programming register 313, a Digital Computer 314 in combination with a Display 315, a GPS based timing block, GPS Receiver 316, and an I/O block 317. The I/O block 317 supporting for external communications from the Multichannel Digital Analyzer 300 to a network and therein other devices according to a predetermined standard such as, for example, IEEE 802.11, IEEE 802.15, IEEE 802.16, IEEE 802.20, UMTS, GSM 850, GSM 900, GSM 1800, GSM 1900, CPRS, ITU-R 5.138, ITU-R 5.150, ITU-R 5.280, and IMT-2000.

The Clock Signal from Master Clock 310 is distributed to all the Current and Voltage Channels circuits 303 and 304 respectively and to the Converter Control 311. Master Clock 310 provides the Real Time Clock reference for Asynchronous Power Measurement Systems according to some embodiments of the invention for all the measurements.

Converter Control 311 receives Data Ready signals from all the Current and Voltage Channels 303 and 304 respectively, as well as Clock Signal from the Master Clock 310. It also provides the All Data Ready signal to the Data Read block 312 and generates a "No Synchronicity" flag when lack of synchronicity between all Current and Voltage Channels 303 and 304 respectively is detected.

Data Read block 312 is connected to the All Data Ready line from the Converter Control 311. It is also connected to Read Data input on all the Current and Voltage Channels 303 and 304 respectively. It is connected to the Data Output line from each of the Current and Voltage Channels 303 and 304 respectively. It is also connected to the Digital Computer 314). It receives the All Data Ready signal from the Converter Control 311 and then reads Data from all the Current and Voltage Channels 303 and 304 respectively and sends it to the Digital Computer 314.

The Programming register 313 is connected to the Input Range line and Power Up line of each of the Current and Voltage Channels 303 and 304 respectively, and to the Digital Computer 314. It provides signals to individually turn ON or OFF and set the input sensitivity range on each of the Current and Voltage Channels 303 and 304 respectively, under the Digital Computer 314 control.

The Display 315 is connected to the Digital Computer 314 and may be used to display results as well as control information relating to control operation of the Asynchronous Power Measurement System. Optionally Display 315 may be a touch screen and may form a predetermined portion of the Digital Computer 314 such as in the instance of a tablet PC for example. GPS Receiver 316 is connected to the Digital Computer 314 and is provides Universal Coordinated Time for the synchronization and the reference. Optionally GPS Receiver 316 may provide geographic location information to the software application(s) executing on the Digital Computer 314 including those relating to the Asynchronous Power Measurement System. The I/O block 317 is connected to the Digital Computer 314 and provides communications to other electronic devices locally and remotely as well as other computers according to one or more predetermined standards such as discussed above including for example the Internet and wireless communication.

Digital Computer 314 is connected to the Converter Control 311, Data Read block 314, Programming block 313, Display 315, GPS receiver 316, and I/O block 317. Digital Computer 314 executes one or more software applications and routines to control operation of the Asynchronous Power Measurement System and to communicate with the operator. Such communications may be through a keyboard, not shown for clarity, Display 315 and other interfaces known to those of skill in the art. Optionally, the Display 315 may be a discrete touchscreen or a touchscreen forming part of a laptop computer, tablet PC etc. The Digital Computer 314 allows the user of the Asynchronous Power Measurement System to enter commands, to process the incoming information and calculate the requested parameters, to present the results on the Display 316 in digital and/or graphic forms as determined by the Digital Computer 314 or the user. Digital Computer 314 also may aggregate test results, synchronize the results to the Universal Coordinated Time and/or geographic location, to store the results for documentation and for the future use, to transmit the results to another device, to automate the calibration of the Asynchronous Power Measurement System and keep the calibration information and to monitor the hardware performance.

Optionally multiple elements of the Asynchronous Power Measurement System such as the Display, Digital Computer, GPS receiver and I/O block may all be part of a single portable or fixed electronic device such as for example a laptop computer, tablet computer, palmtop computer, PC, smartphone, or PDA. Alternatively, multiple elements of the Asynchronous Power Measurement System may be implemented within a dedicated electronic component such as for example an ASIC or FPGA.

Figure 4:
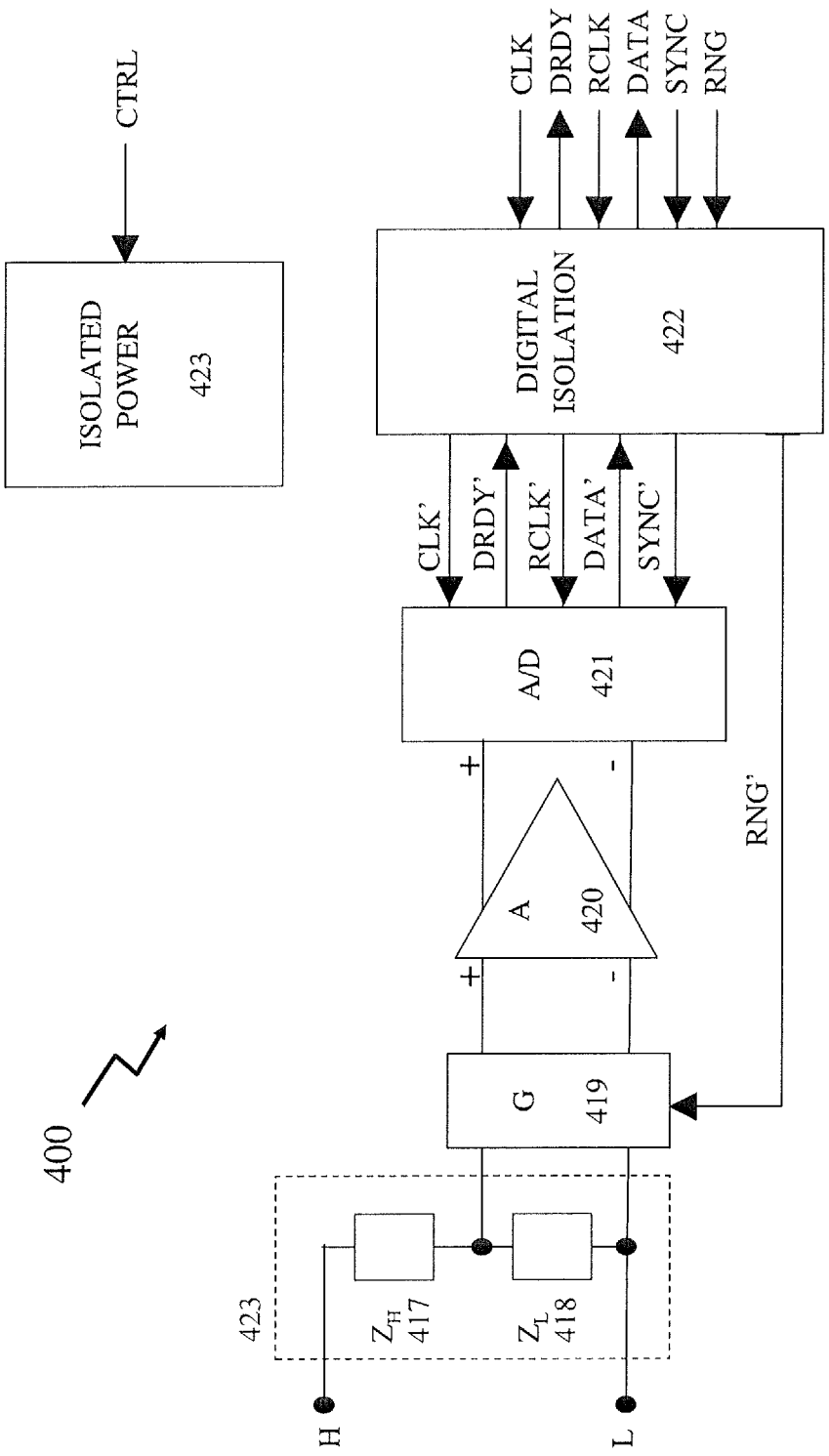
FIG. 4 depicts a block diagram according to an embodiment of invention of the Voltage Channel of the system depicted in FIG. 1.

Referring to FIG. 4 there is depicted a block diagram according to an embodiment of invention of a Voltage Channel 400 of an Asynchronous Power Measurement System such as described above in respect of Voltage Channels 104, 204, and 304 in FIGS. 1 through 3 respectively. As presented Voltage Channel 400 consists of an input Voltage Divider comprising $Z_H$ 417 and $Z_L$ 418, Gain Switch 419, differential input-differential output Amplifier 420, Analog to Digital Converter (A/D Converter) 421, Digital Signal Isolator 422, and an Isolated Power Converter 423.

The input voltage is first reduced in the Voltage Divider 423 comprising $Z_H$ 417 and $Z_L$ 418 such that the resulting resistive divided voltage is matched to the required levels of the Gain Switch 419. The outputs from Gain Switch 419 provide the dual inputs for a fully differential Amplifier 420 which provides biased and balanced differential signals to the Analog to Digital Converter 421. Digital Isolator 423 provides bidirectional communication between the Voltage Channel 400 and the Digital Analyzer such as Digital Analyzers 107 and 207 in FIGS. 1 and 2 respectively. Isolated Power Converter 423 provides stable internal voltages for the isolated functional blocks of Voltage Channel 400, as well as means to turn the power ON or OFF overall. Optionally the Voltage Divider 423 may include frequency compensation components in association with either $Z_H$ 417 and/or $Z_L$ 418.

Figure 5:
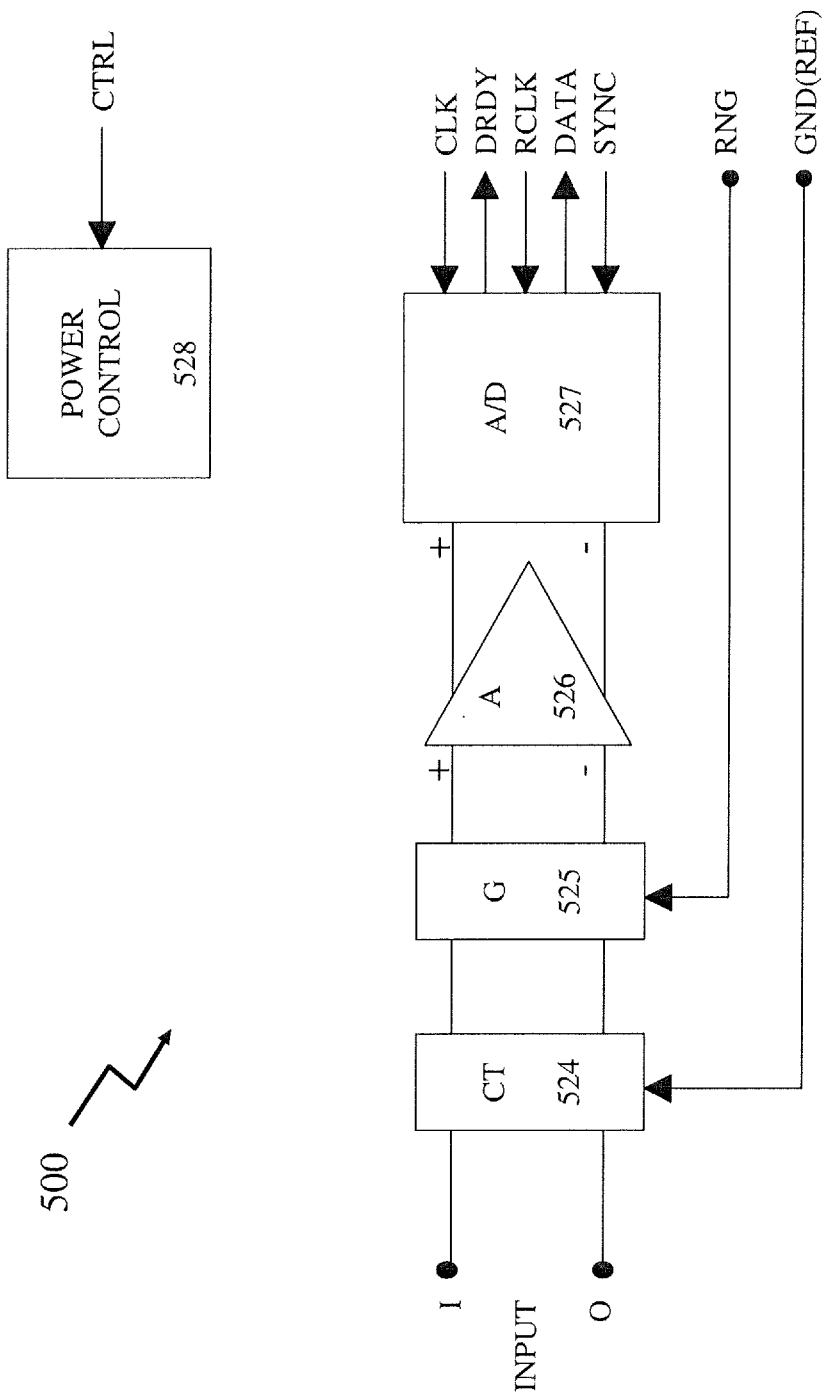
FIG. 5 depicts a block diagram according to an embodiment of invention of the Current Channel of the system depicted in FIG. 1.

Referring to FIG. 5 there is depicted a block diagram according to an embodiment of invention of a Current Channel 500 of an Asynchronous Power Measurement System such as described above in respect of Voltage Channels 104, 204, and 304 in FIGS. 1 through 3 respectively. As presented the Current Channel 500 consists of an input Current Transducer (CT) 524, Gain Switch 525, differential input-differential output Amplifier 526, Analog to Digital Converter 527 and the Power Control Block 528.

An input current is isolated and converted to voltage in the precision Current Transducer (CT) 524 and matched to the required level in the Gain Switch 525. Fully differential Amplifier 526 provides biased and balanced differential signal to the Analog to Digital Converter 527. Power Control Block 528 provides stable internal voltages and a means to turn the Current Channel 5000N or OFF. Current Channel 500 communicates directly with the Digital Analyzer such as Digital Analyzers 107 and 207 in FIGS. 1 and 2 respectively.

Figure 6:
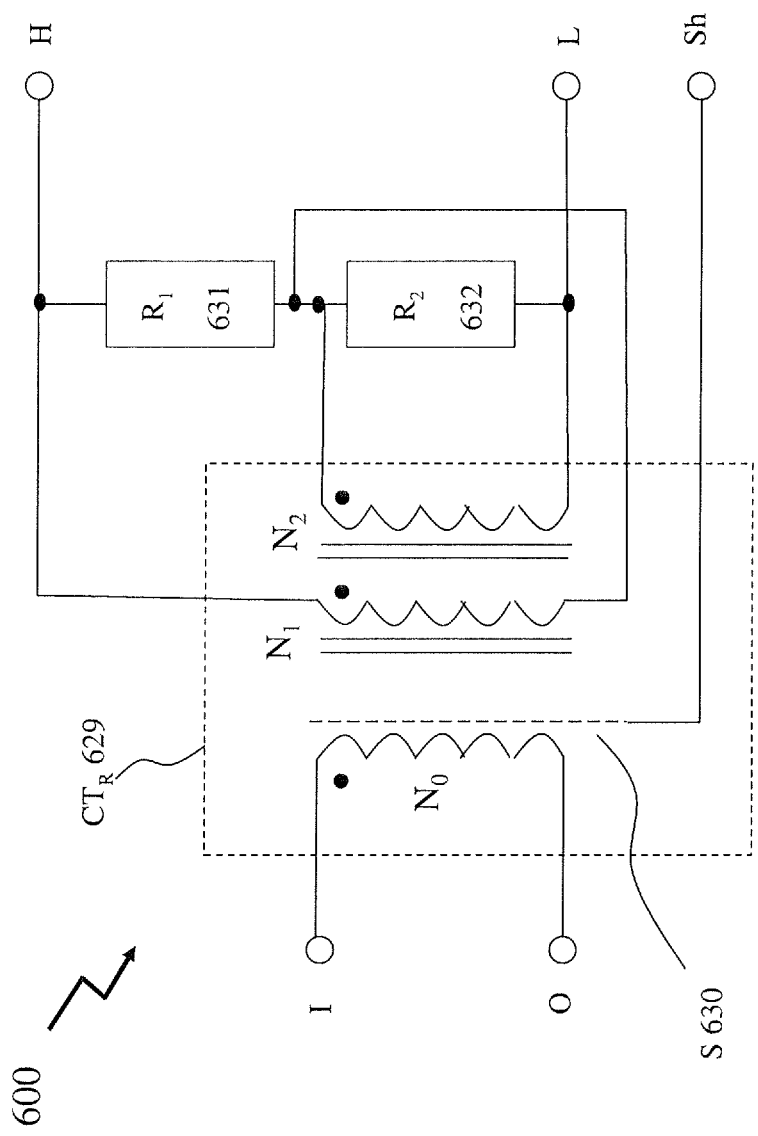
FIG. 6 depicts an electrical circuit of an exemplary embodiment of the Current Transducer forming part of the Current Channel depicted in FIG. 5.

Now referring to FIG. 6 there is depicted an embodiment of a Current Transducer (CT) 600 such as discussed supra in respect of Current Transducer (CT) 524 in FIG. 5. CT 600 consists of a dual stage current transformer $CT_R$ 629 containing primary winding $N_0$ and first and second secondary windings $N_1$ and $N_2$ respectively. The Current Transducer 629 primary input terminal $I_{IN}$ is connected to the start connection of the primary winding $N_0$, while the end connection of $N_0$ is connected to the primary output terminal $I_{OUT}$. An electrical shield S 630 is placed between the primary and the secondary sides and connected to a dedicated shield terminal Sh. Winding $N_1$ is loaded with a precise resistance $R_1$ 631 and second stage winding $N_2$ is loaded with a precise resistance $R_2$ 632. The High output terminal H of the Current Transducer 600 is connected to the start connection of secondary winding $N_1$, while the end connection of winding $N_1$ is connected to the start connection of second stage winding $N_2$. End connection of second stage winding $N_2$ is connected to the Low output terminal L of the transducer. Accordingly current passing through the primary winding $N_0$ produces a proportional voltage between output terminals H and L.

Referring to FIG. 7 there is depicted a Current Transducer according to an embodiment of the invention such as described supra in respect of Current Transducer (CT) 600 in FIG. 6. Accordingly first image 700A depicts the CT sequentially stripped from the outermost layer towards the centre whilst second image 700B depicts a three dimensional quarter-cut sectional view with first to fifth tape layers 730A through 730E respectively and shielding 760. Accordingly as shown the CT comprises first and second cores 710 and 720 respectively. Second core 720 then has first tape layer 730A separating the first winding 740 from it which is then overwound with second tape layer 730B. The first and second cores 710 and 720 with their respective surrounding layers are then overwound with third tape layer 730C. Atop third tape layer 730C second winding 750 is wound around both the first and second cores 710 and 720 respectively. Second winding 750 is then overwound by fourth tape layer 730D, shielding 760, fifth tape layer 730E and third winding 770. As depicted first winding 740 corresponds to second secondary winding $N_2$ of FIG. 6, second winding 750 corresponds to first secondary winding $N_1$ of FIG. 6, and third winding 770 corresponds to the primary winding $N_0$ of FIG. 6. Optionally a second shielding may be disposed between the first and second windings 740 and 750 respectively such as between second and third tape layers 730B and 730C respectively.

Second image 700B depicts a three dimensional quarter-cut sectional view with first to fifth tape layers 730A through 730E respectively and shielding 760 removed thereby showing how the first to third windings 740, 750 and 770 respectively are wound around the closed magnetic elements forming the first and second cores 710 and 720 respectively. It would be evident to one skilled in the art that the number of windings for each of the first to third windings 740, 750, and 770 respectively and geometries of the first and second cores 710 and 720 respectively may be adjusted according to the electrical voltage, current and power of the signal being measured and design of the Asynchronous Power Measurement System within which the Current Transducer forms part.

Figure 7A:
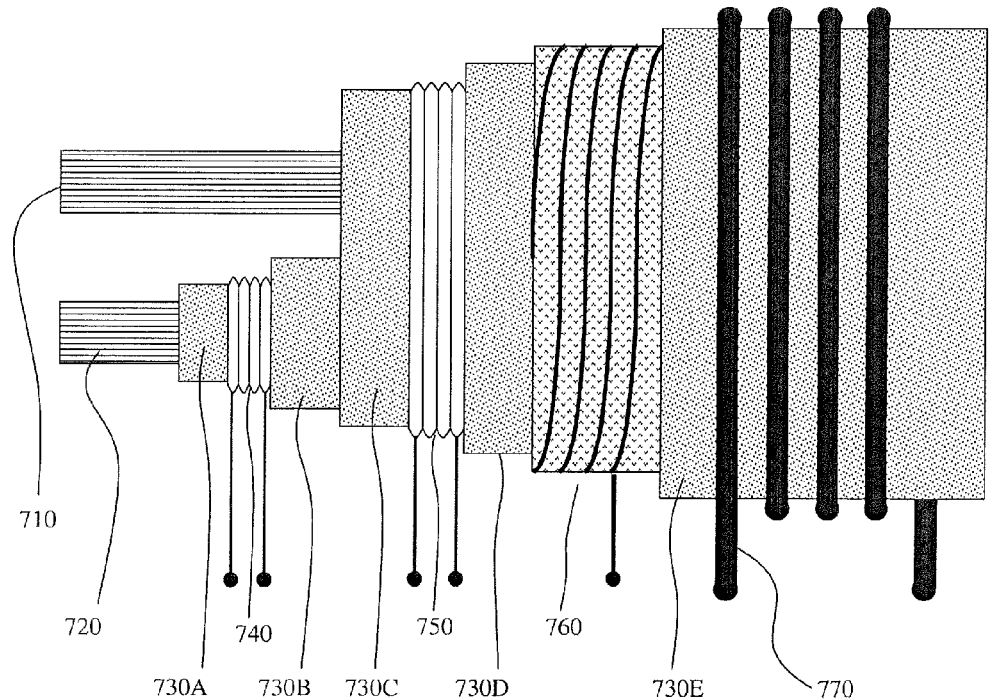
FIGS. 7A through 7C depict dual stage current transformers according to embodiments of the invention which when resistively connected as described in FIG. 6 provide implementations of the Current Transducer.
Figure 7A:
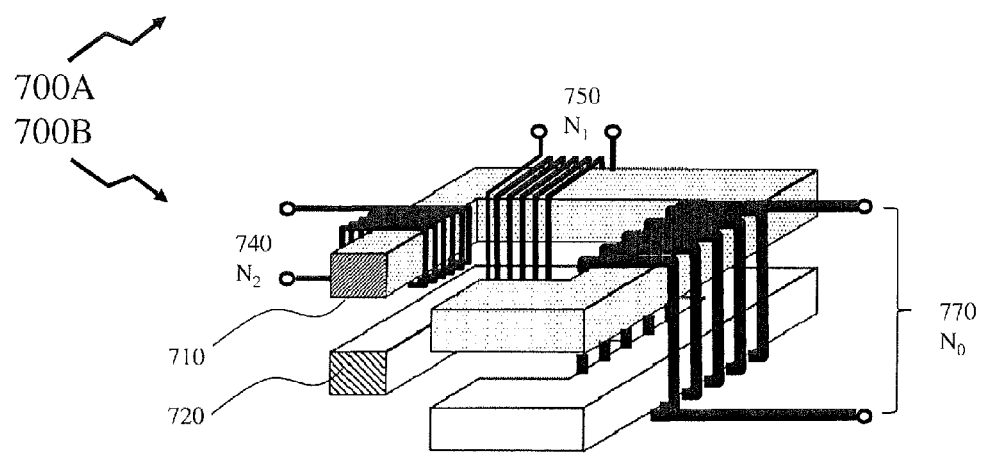
Figure 7B:
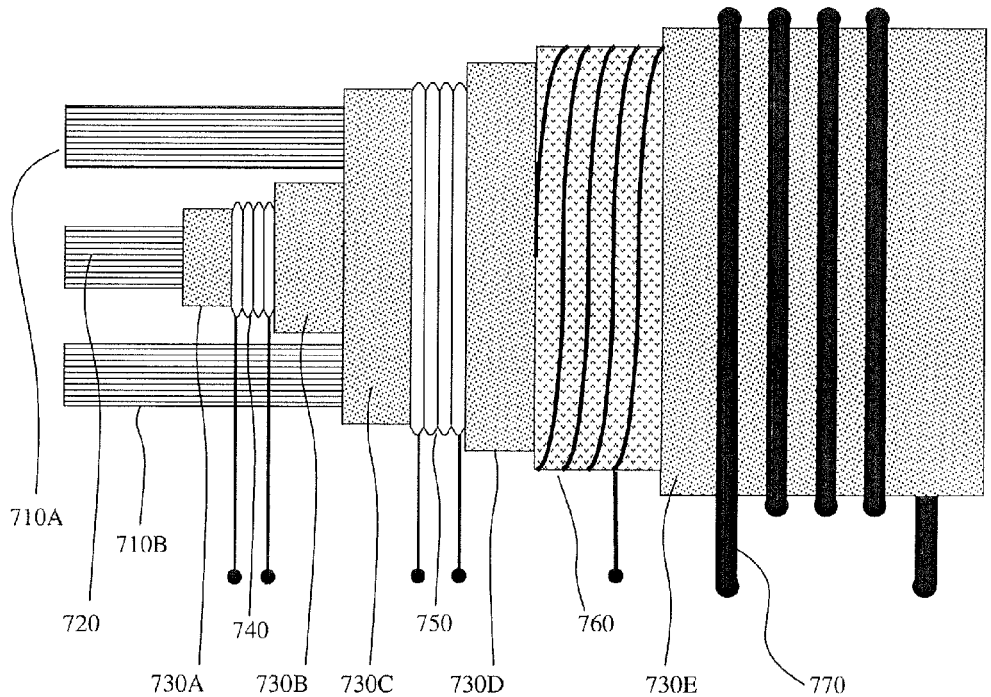
Figure 7B:
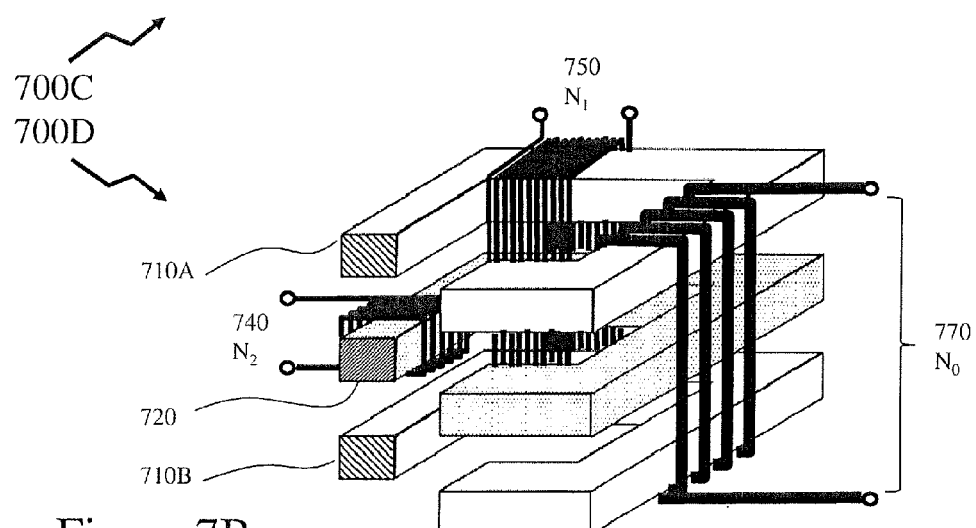

Referring to FIG. 7B there is depicted a Current Transducer according to an embodiment of the invention such as described supra in respect of Current Transducer (CT) 600 in FIG. 6. Accordingly first image 700C depicts the CT sequentially stripped from the outermost layer towards the centre whilst second image 700D depicts a three dimensional quarter-cut sectional view with first to fifth tape layers 730A through 730E respectively and shielding 760. Accordingly as shown the CT comprises first, second, and third cores 710A, 720, and 710B respectively. Second core 720 then has first tape layer 730A separating the first winding 740 from it which is then overwound with second tape layer 730B. The first, second, and third cores 710A, 720, and 710B respectively with their respective surrounding layers are then overwound with third tape layer 730C. Atop third tape layer 730C second winding 750 is wound around first, second, and third cores 710A, 720, and 710B respectively. Second winding 750 is then overwound by fourth tape layer 730D, shielding 760, fifth tape layer 730E and third winding 770. As depicted first winding 740 corresponds to second secondary winding $N_2$ of FIG. 6, second winding 750 corresponds to first secondary winding $N_1$ of FIG. 6, and third winding 770 corresponds to the primary winding $N_0$ of FIG. 6. Optionally a second shielding may be disposed between the first and second windings 740 and 750 respectively such as between second and third tape layers 730B and 730C respectively.

Second image 700D depicts a three dimensional quarter-cut sectional view with first to fifth tape layers 730A through 730E respectively and shielding 760 removed thereby showing how the first to third windings 740, 750 and 770 respectively are wound around the closed magnetic elements forming the first, second, and third cores 710A, 720, and 710B respectively. It would be evident to one skilled in the art that the number of windings for each of the first to third windings 740, 750, and 770 respectively and geometries of the first, second, and third cores 710A, 720, and 710B respectively may be adjusted according to the electrical voltage, current and power of the signal being measured and design of the Asynchronous Power Measurement System within which the Current Transducer forms part.

Figure 7C:
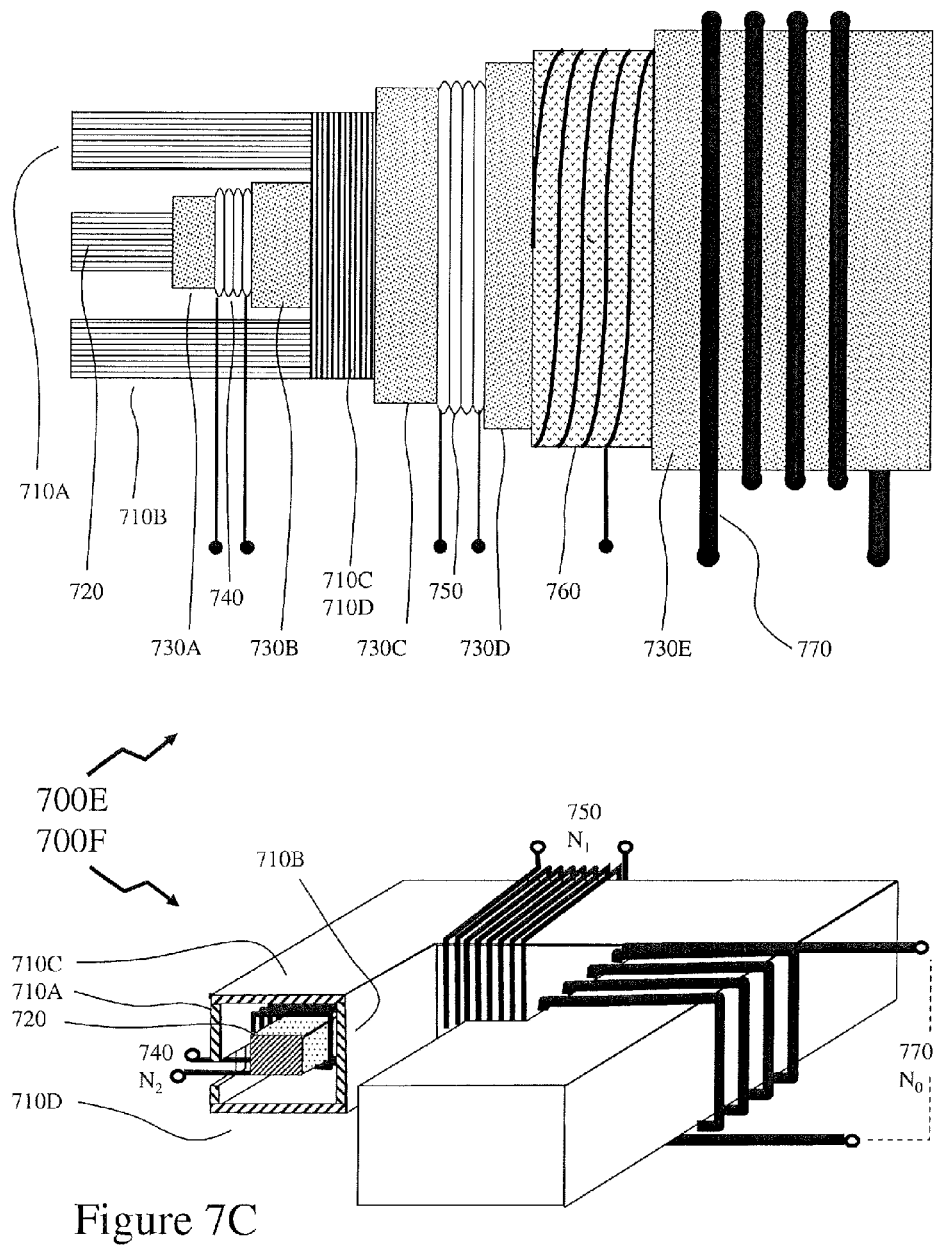

Referring to FIG. 7C there is depicted a Current Transducer according to an embodiment of the invention such as described supra in respect of Current Transducer (CT) 600 in FIG. 6. Accordingly first image 700E depicts the CT sequentially stripped from the outermost layer towards the centre whilst second image 700F depicts a three dimensional quarter-cut sectional view with first to fifth tape layers 730A through 730E respectively and shielding 760. Accordingly as shown the CT comprises first and second core elements 710A and 710B respectively of the first core and second core 720 respectively. Second core 720 then has first tape layer 730A separating the first winding 740 from it. First and second core elements 710A and 710B respectively of the first core are coupled to third core element 710C and fourth core element 710D (not visible in this view) which thereby enclose the first winding 740 which is overwound with second tape layer 730B.

The first core comprising first to fourth core elements 710A through 710D respectively, within which second core 720 and first winding 740 are enclosed is then overwound with third tape layer 730C and then second winding 750. Second winding 750 is then overwound by fourth tape layer 730D, shielding 760, fifth tape layer 730E and third winding 770. As depicted first winding 740 corresponds to second secondary winding N2 of FIG. 6, second winding 750 corresponds to first secondary winding N1 of FIG. 6, and third winding 770 corresponds to the primary winding N0 of FIG. 6. Optionally a second shielding may be disposed between the first and second windings 740 and 750 respectively such as between second and third tape layers 730B and 730C respectively.

Second image 700F depicts a three dimensional quarter-cut sectional view with first to fifth tape layers 730A through 730E respectively and shielding 760 removed thereby showing how the first to third windings 740, 750 and 770 respectively are wound around the closed magnetic elements formed by first core, comprising first to fourth first core elements 710A through 710D respectively, and second core 720 respectively. As depicted first winding 740 is fed through an opening within first core element 710A although other constructions would be evident to one skilled in the art. It would also be evident to one skilled in the art that the number of windings for each of the first to third windings 740, 750, and 770 respectively and geometries of the first, second, and third cores 710A, 720, and 710B respectively may be adjusted according to the electrical voltage, current and power of the signal being measured and design of the Asynchronous Power Measurement System within which the Current Transducer forms part.

Alternatively the transformer may be shell form or a combination of core and shell forms. Shell form designs may be more prevalent than core form designs for distribution transformer applications due to the relative ease in stacking the core around the winding coils. Core form designs tend to, as a general rule, be more economical, and therefore more prevalent, than shell form designs for high voltage power transformer applications at the lower end of their voltage and power rating ranges. At higher voltage and power ratings, shell form transformers tend to be more prevalent. Shell form design tends to be preferred for extra high voltage and higher MVA applications because, though more labor intensive to manufacture, shell form transformers are characterized as having inherently better kVA-to-weight ratio, better short-circuit strength characteristics and higher immunity to transit damage.

As noted supra high precision AC measurements require precise analog to digital conversions and precise timing information. Within the prior art approaches to increasing measurement precision and repeatability have focused on synchronizing the sampling frequency to the fundamental frequency of the incoming signal and maintaining the number of samples per period constant. Whilst these prior art techniques through synchronization to the fundamental frequency allow for accurate, repeatable measurements of magnitude, frequency and phase of the tested signal these require that the signal under test is "stationary". However, in most real-world applications the signal under test is "non-stationary" as a result of noise and jitter for example. These "non-stationary" signals being measured may arise either as the result of supply variations and varying loads when the measurements, the latter arising particularly when the measurements are being performed on live operating systems. As such these "non-stationary" waveforms result in increased measurement uncertainty within prior art systems. These issues are particularly exacerbated where the measurement being performed requires determination of zero-crossing events.

Figure 8:
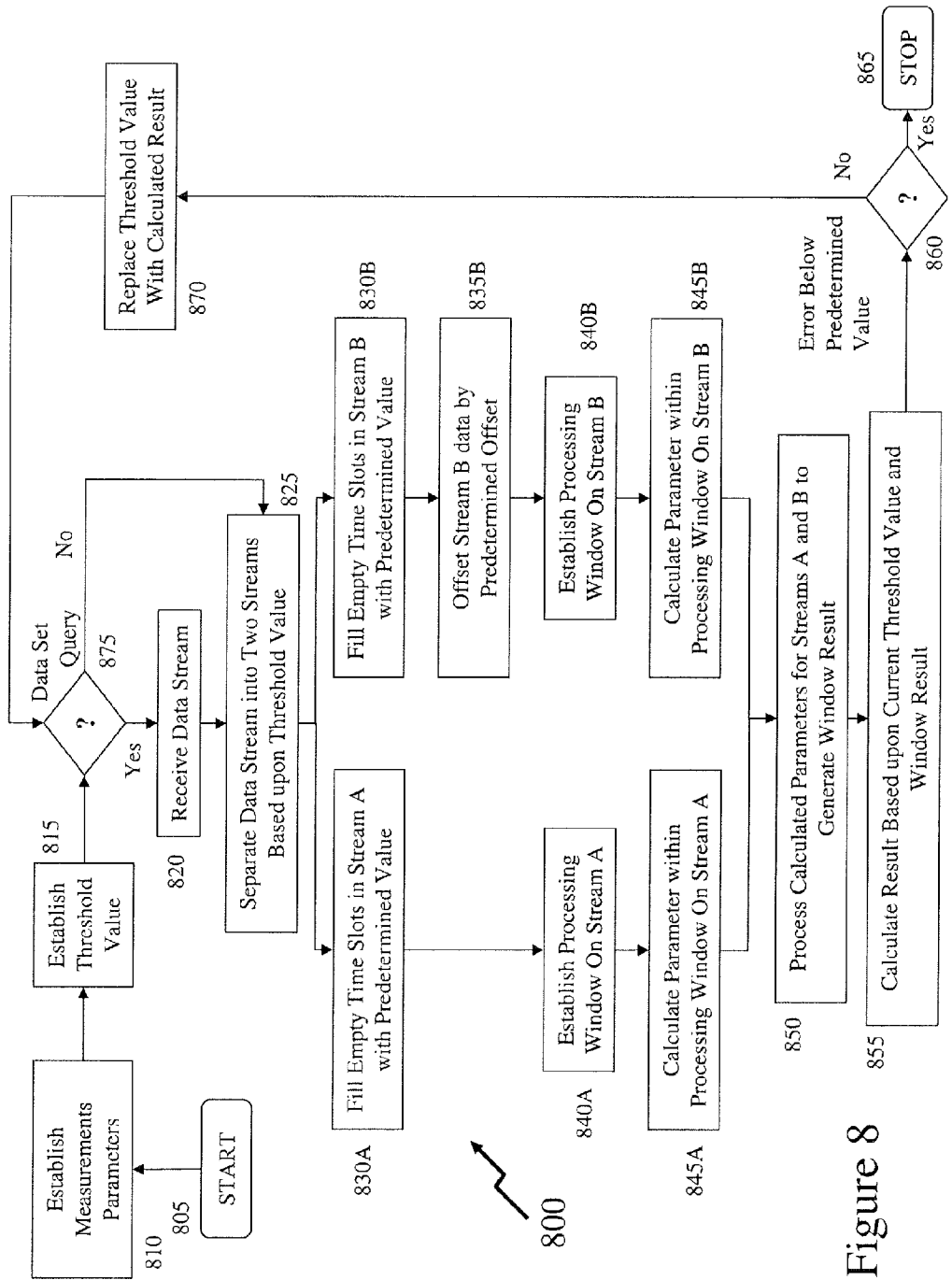
FIG. 8 depicts a process flow for a non-linear data integration methodology to provide accurate measurements on "non-stationary" signals.

Referring to FIG. 8 there is depicted a process flow for a non-linear data integration methodology to provide accurate measurements on "non-stationary" signals. Such a non-linear data integration process may be employed to perform precise calculations of signal parameters such as Root Mean Square (RMS) voltage and RMS current using a limited number of asynchronous digital data points. The method may also be employed to calculate other quantities relating to the signal including, but not limited, to average value and rectified average value.

Referring to FIG. 8 a first process flow 800 is depicted which starts at step 805 and proceeds to step 810 wherein the parameters relating to the measurement are established, e.g. RMS, Voltage, 100 seconds. Next in step 815 an initial threshold value is established, which may be as the result of a previous measurement, a measurement result stored within memory, a measurement derived from an initial "rough" analysis, or a default value. Subsequently in step 875 the process determines whether a new data set is to be retrieved, in which event the process flows to step 820 and the process receives a data stream for analysis which is then split in step 825 into two separate data streams based upon the threshold value, e.g. a first data stream for those data stream samples above the threshold and a second data stream for those data stream samples below the threshold. If no new data is to be retrieved then the process flow proceeds directly from step 875 to step 825 where the data is split into two separate data streams as described above. For one data stream, referred to as Stream A, the empty time slots where data samples were separated into the second data stream, referred to as Stream B, then thee "empty" time slots are filled in step 830A with the predetermined value, e.g. the threshold value established in step 815 or that replaced in step 870 for subsequent iterations with the calculated result from the preceding iteration. Next in step 840A a processing window is established with respect to the filled data Stream A and then in step 845A the parameter established in step 810 is calculated upon the filled data Stream A values within the processing window.

In steps 830B, 840B and 845B the same sequence of steps is performed upon the second part of the data stream, Stream B, however, step 835B has been added between steps 830B and 840B so that the data stream of Stream B is offset by a predetermined offset prior to establishing the processing window on Stream B. Subsequently in step 850 the results from calculating the parameter upon Streams A and B are processed to generate a Window Result which is then employed in conjunction with the threshold value established in step 815 to define the result in step 855. Next in step 860 a decision as to whether the error has reduced below a predetermined value. If yes then the process proceeds to step 865 and stops. Otherwise the process proceeds to step 815 wherein the generated result from 855 is stored as the threshold value and the process repeats.

Figure 9:
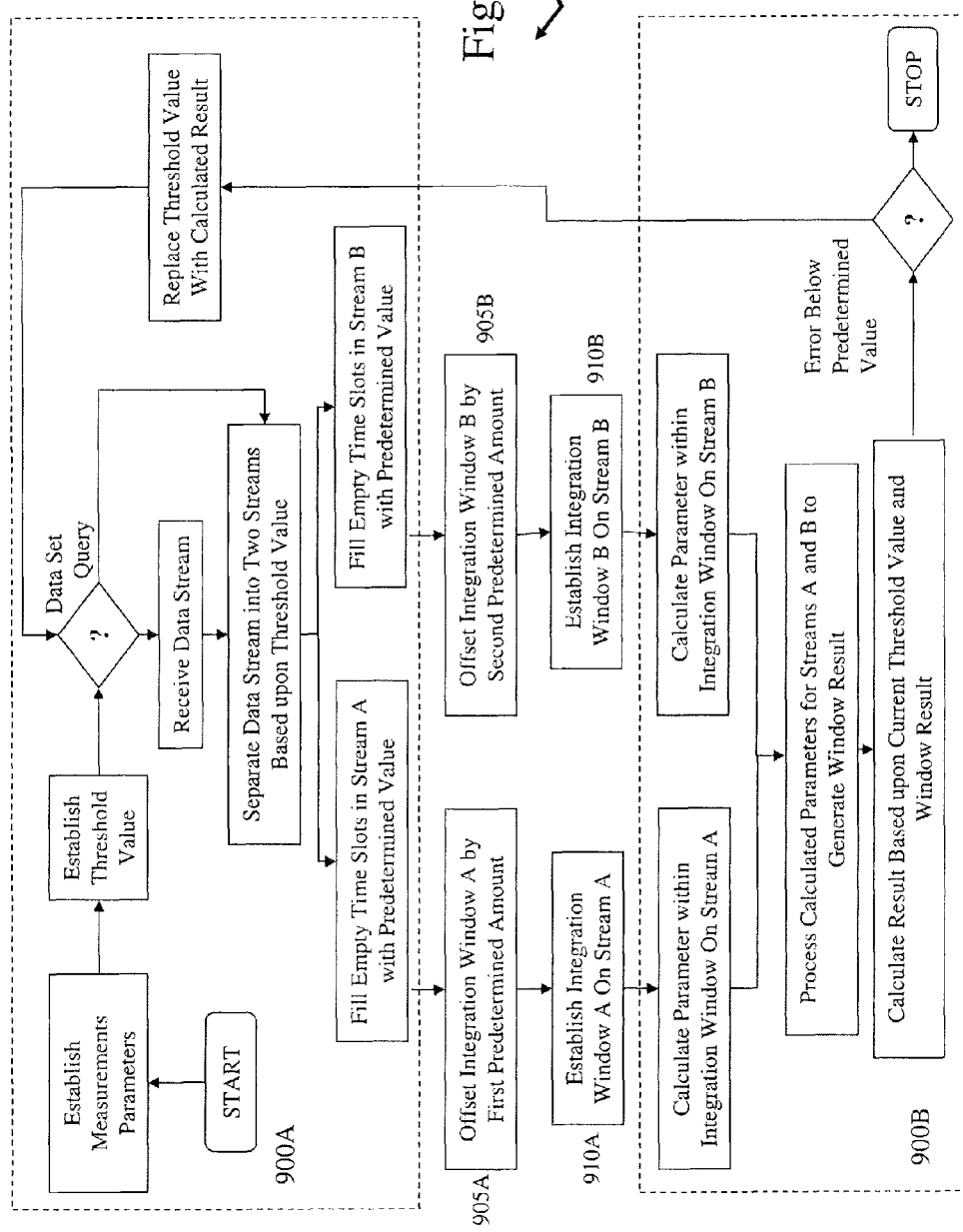
FIG. 9 depicts a process flow variation to FIG. 8 for the non-linear data integration methodology to provide accurate measurements on "non-stationary" signals.

Now referring to FIG. 9 a second process flow 900 is depicted which is essentially structured the same as first process flow 800 comprising first block 900A which contains a process duplicating process steps 805 through 830A and 830B and second block 900B which contains a process duplicating process steps 845A through 875. Disposed between first and second blocks 900A and 900B are first to fourth process steps 905A, 905B, 910A, and 910B respectively. First and third process steps 905A and 910A form a first flow wherein an Integration Window A is offset by a first predetermined amount with respect to Stream A prior to establishing the integration window onto Stream A. Similarly second and fourth process steps 905B and 910B form a second flow offsetting an Integration Window B by a second predetermined amount with respect to Stream B prior to establishing this integration window onto Stream B.

Within the methods described above in respect of first and second process flows 800 and 900 Stream B is described as being offset by a predetermined offset. It would be evident to one skilled in the art that optionally Stream A may be offset relative to Stream B rather than vice-versa and that the predetermined offset may be by a predetermined number of time slots, including positive, zero, and negative integer timeslot offsets, as well as non-integer timeslot offsets, similarly positive, zero, or negative, with processing applied to overlapping timeslots which now overlap a timeslot to be processed, e.g. average 50% of each timeslot or sum timeslots for example. Further, within first and second process flows 800 and 900 there is described a decision to employ a new data set for an "iteration" of the process flow it would be evident to one skilled in the art that the new data set may be a sub-set of an initial data set also employed for the first data set such as for example wherein the subsequent data sets are offset by a predetermined number of time slots, including positive, zero, and negative offsets, or narrowed/expanded by a predetermined number of time slots based upon decisions made in dependence upon the overall process and that of the channel analyzer within which the process is executed. For example, an initial data set may comprise multiple cycles of the signal being analysed to establish for example the offset of the signal from 0V whilst subsequent iterations replace the multiple cycle data set with single cycle data sets or a few cycle data sets to extract per cycle information.

Within the methods described above in respect of first and second process flows 800 and 900 within step 870 the threshold value is described and being replaced with the current calculated result. However, it may optionally include a decision step of whether the threshold value should be replaced as well as an optional processing function to establish the new threshold value in dependence upon a combination of factors including, but not limited to, the existing threshold value, the calculated result, the error, the measurement being performed, and the number of iterations performed so far. Alternatively, the new threshold value may not be constant across the time slots being "stuffed" but may vary, such as for example, being set to one of a plurality of thresholds of a predetermined subset of the plurality of thresholds are employed, a reproduction of a predetermined portion of the signal, or a predetermined mathematical function. The predetermined mathematical function may be selected, or factors within a predetermined mathematical function established, in dependence upon a combination of factors including, but not limited to, the existing threshold value, the calculated result, the error, the measurement being performed, and the number of iterations performed so far.

Whilst the methods described above in respect of first and second process flows 800 and 900 has been described in respect of data stream produced by a direct measurement it would be evident that the data stream may be either one stored within a digital memory for subsequent analysis or may be a data stream acquired real time with pre-processing by analog and/or digital processing such as for example applying a priori mathematical operation(s). It would also be evident that the process may be applied using a combination of such techniques such that real time is being stored into a buffer for processing as soon as processing resources are available. Accordingly, a single processor may be executing multiple analysis/calculation threads in parallel rather than sequentially. Such a technique may also be applied to such that a single time-slot of acquired data is employed in multiple measurements such as, for example, in performing an equivalent of a "moving-average." First and second process flows 800 and 900 in processing the data stream for a power channel measurement may be deployed within a single or multi-channel analyzer such as described supra in respect of Multichannel Signal Analyzers 107, 207 and 300 in FIGS. 1-3 respectively. Within first and second process flows the process windows may, for example, be established as being approximately equal to the period of the input signal such, that the beginning and the end are located over the data stream time slots which are to be filled with the threshold value so that stream data samples are not lost within the analysis. Optionally, the position of the processing window, e.g. an integration window, may be centred to the sample data stream or established with predetermined offsets to the first sample point within the data stream established from the thresholding.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

What is claimed is:

1. An asynchronous AC measurement system comprising:
    an isolated current channel converter that transforms a current applied to the input by a power signal to a current within a predetermined range and digitizes said current;
    an isolated voltage channel converter that transforms a voltage applied to the input by the power signal to a voltage within a predetermined range and digitizes said voltage;
    a digital analyzer comprising at least a microprocessor that processes said digital representations of at least one of the voltage and current of the input signal to determine at least one of a parameter of the input signal and a power quality parameter of the input signal;
    wherein determining at least one of the power of the power signal and a power quality parameter of the power signal comprises at least one of:
    processing said digital representations of the voltage and current of the power signal for a predetermined measurement period; and
    determining at least one of current, voltage, power, phase angle, and impedance; and
    wherein the predetermined measurement period is established for power signals below a predetermined frequency in dependence upon at least a predetermined reference level.

2. The asynchronous AC measurement system according to claim 1, wherein the isolated current channel converter comprises at least a two stage current transformer which converts the secondary current generated in the first stage of the two stage transformer to a voltage, converts a compensating secondary current generated in the second stage of the two stage transformer to a compensating voltage, and adds the voltages after conversion.

3. The asynchronous AC measurement system according to claim 1, wherein the isolated current comprises at least electrical shielding between the primary and secondary windings.

4. The asynchronous AC measurement system according to claim 1, wherein the isolated current channel converter is remote from the digital analyzer and may be directly located onto a power cable.

5. The asynchronous AC measurement system according to claim 1, wherein a core of the isolated current channel converter consists of at least two parts that may be separated and reconnected together.

6. The asynchronous AC measurement system according to claim 1, wherein the isolated current channel converter and isolated voltage channel converter at least one of digitally sample simultaneously, digitally sample independently from one another, and digitally sample at a sampling frequency that is independent of the power signal being analyzed.

7. The asynchronous AC measurement system according to claim 1, wherein the predetermined reference level is set in dependence upon at least a change of the determined at least one of the power of the power signal and a power quality parameter of the power signal.

8. The asynchronous AC measurement system according to claim 1, wherein processing said digital representations of at least one of the voltage and current of the input signal comprises:
   splitting said digital representation into at least two sub-streams of a plurality of sub-streams where sub-stream comprising a portion of the digital representation established in dependence upon a predetermined threshold;
   processing each sub-stream of the plurality of sub-streams independently to establish a sub-stream output; and
   processing the plurality of sub-stream outputs to generate an output.

9. The asynchronous AC measurement system according to claim 8, wherein each element of the digital representation of those portions of each sub-stream absent the digital representation is stuffed with a value that is at least one of predetermined prior to their processing and established in dependence upon at least a predetermined mathematical function; and
   the processing of said digital representations iterates until an error between successive iterations meets a predetermined threshold and wherein the output of an iteration is employed as the predetermined threshold within the next iteration.

10. The asynchronous AC measurement system according to claim 1, further comprising at least one of:
   N further current channel converters and N further voltage channel converters coupled to the digital analyzer for M phase power signal measurements without a common return, where N=M−1 and N and M are positive integers; and
   N further current channel converters and N further voltage channel converters coupled to the digital analyzer for M phase power signal measurements where there is a common return, where N=M and N and M are positive integers.

11. A method for an asynchronous power measurement system comprising:
   providing an isolated current channel converter for transforming a current applied to a load by a power signal to a current within a predetermined range and digitizing said current;
   providing an isolated voltage channel converter for transforming a voltage applied to the load by the power signal to a voltage within a predetermined range and digitizing said voltage;
   providing a digital analyzer comprising at least a microprocessor for processing said digital representations of at least one of the voltage and current of the power signal to determine at least one of the power of the power signal and a power quality parameter of the power signal;
   wherein determining at least one of the power of the power signal and a power quality parameter of the power signal comprises at least one of:
   processing said digital representations of the voltage and current of the power signal for a predetermined measurement period; and
   determining at least one of current, voltage, power, phase angle, and impedance; and
   wherein for power signals below a predetermined frequency the predetermined measurement period is established in dependence upon at least a predetermined reference level.

12. The method for an asynchronous power measurement system according to claim 11, wherein providing the isolated current channel converter comprises providing at least a two stage current transformer that:
   converts the secondary current generated in a first stage of the two stage transformer to a voltage, converts a compensating secondary current generated in the second stage of the two stage transformer to a compensating voltage, and adds the voltages after conversion;
   is remote from the digital analyzer and may be directly located onto a power cable; and comprises at least a core composed of at least two parts that may be separated and reconnected together; and
   comprises providing at least electrical shielding between the primary and secondary windings.

13. The method for an asynchronous power measurement system according to claim 11, wherein at least one of:
   the isolated current channel converter is remote from the digital analyzer and may be directly located onto a power cable; and
   a core of the isolated current channel converter consists of at least two parts that may be separated and reconnected together.

14. The method for an asynchronous power measurement system according to claim 11, wherein the isolated current channel converter and isolated voltage channel converter at least one of digitally sample simultaneously, digitally sample independent from one another, and digitally sample at a sampling frequency that is independent of the power signal being analyzed.

15. The method for an asynchronous power measurement system according to claim 11, wherein the predetermined reference level is set in dependence upon at least a change of the determined at least one of the power of the power signal and a power quality parameter of the power signal.

16. The method for an asynchronous AC measurement system according to claim 11, wherein processing said digital representations of at least one of the voltage and current of the input signal comprises:
   splitting said digital representation into at least two sub-streams of a plurality of sub-streams where sub-stream comprising a portion of the digital representation established in dependence upon a predetermined threshold;
   processing each sub-stream of the plurality of sub-streams independently to establish a sub-stream output; and
   processing the plurality of sub-stream outputs to generate an output.

17. The method for an asynchronous AC measurement system according to claim 16, wherein each element of the digital representation of those portions of each sub-stream absent the digital representation is stuffed with a value that is at least one of predetermined prior to their processing and established in dependence upon at least a predetermined mathematical function; and
   the processing of said digital representations iterates until an error between successive iterations meets a predetermined threshold and wherein the output of an iteration is employed as the predetermined threshold within the next iteration.

18. The method for an asynchronous power measurement system according to claim 11, further comprising providing at least one of:
- N further current channel converters and N further voltage channel converters coupled to the digital analyzer for M phase power signal measurements without a common return, where N=M−1 and N and M are positive integers; and
- N further current channel converters and N further voltage channel converters coupled to the digital analyzer for M phase power signal measurements where there is a common return, where N=M and N and M are positive integers.

\* \* \* \* \*